United States Patent [19]

Malchow

[11] 4,327,332

[45] Apr. 27, 1982

[54] CIRCUIT ARRANGEMENT USEFUL IN DEVELOPING DECOUPLED OPERATING VOLTAGES FOR IF AMPLIFIER STAGES OF AN INTEGRATED CIRCUIT

[75] Inventor: Max E. Malchow, Flemington, N.J.
[73] Assignee: RCA Corporation, New York, N.Y.
[21] Appl. No.: 117,079
[22] Filed: Jan. 31, 1980
[51] Int. Cl.³ .............................................. H03F 3/45
[52] U.S. Cl. ................................. 330/261; 330/297; 330/307
[58] Field of Search ............... 330/149, 261, 288, 297, 330/307

[56] References Cited

U.S. PATENT DOCUMENTS

| 3,518,458 | 6/1970 | Camenzind ...................... 330/307 X |
| 3,673,499 | 6/1972 | Avins et al. ..................... 334/30 X |
| 4,008,441 | 2/1977 | Schade, Jr. ........................... 330/288 |
| 4,057,763 | 11/1977 | Wheatley, Jr. ....................... 330/288 |

FOREIGN PATENT DOCUMENTS

| 1436285 | of 0000 | United Kingdom . |
| 1444811 | 8/1976 | United Kingdom . |
| 1470736 | 4/1977 | United Kingdom . |
| 1497102 | 1/1978 | United Kingdom . |
| 1535753 | 12/1978 | United Kingdom . |
| 1536023 | 12/1978 | United Kingdom . |

OTHER PUBLICATIONS

RCA Technical Note No. 949, Dec. 31, 1973, "Current-Mirror Amplifiers Having Current Gains Less Influenced by the Base Currents of Component Transistors", by J. S. Radovsky.

Primary Examiner—James B. Mullins
Attorney, Agent, or Firm—P. M. Emanuel; A. L. Limberg; E. M. Whitacre

[57] ABSTRACT

In an integrated circuit structure including IF amplifier stages coupled in cascade by d-c blocking capacitors to restrict the noise bandwidth of an FM receiver in which it is employed and receiving power from a common power supply line, separate operating voltage generating circuits are provided for each amplifier stage to inhibit undesired oscillations. Each voltage generating circuit is decoupled from the power supply line by a respective lateral transistor configuration cooperative with a current mirror amplifier arrangement to supply a reference current to the voltage generating circuit.

16 Claims, 2 Drawing Figures

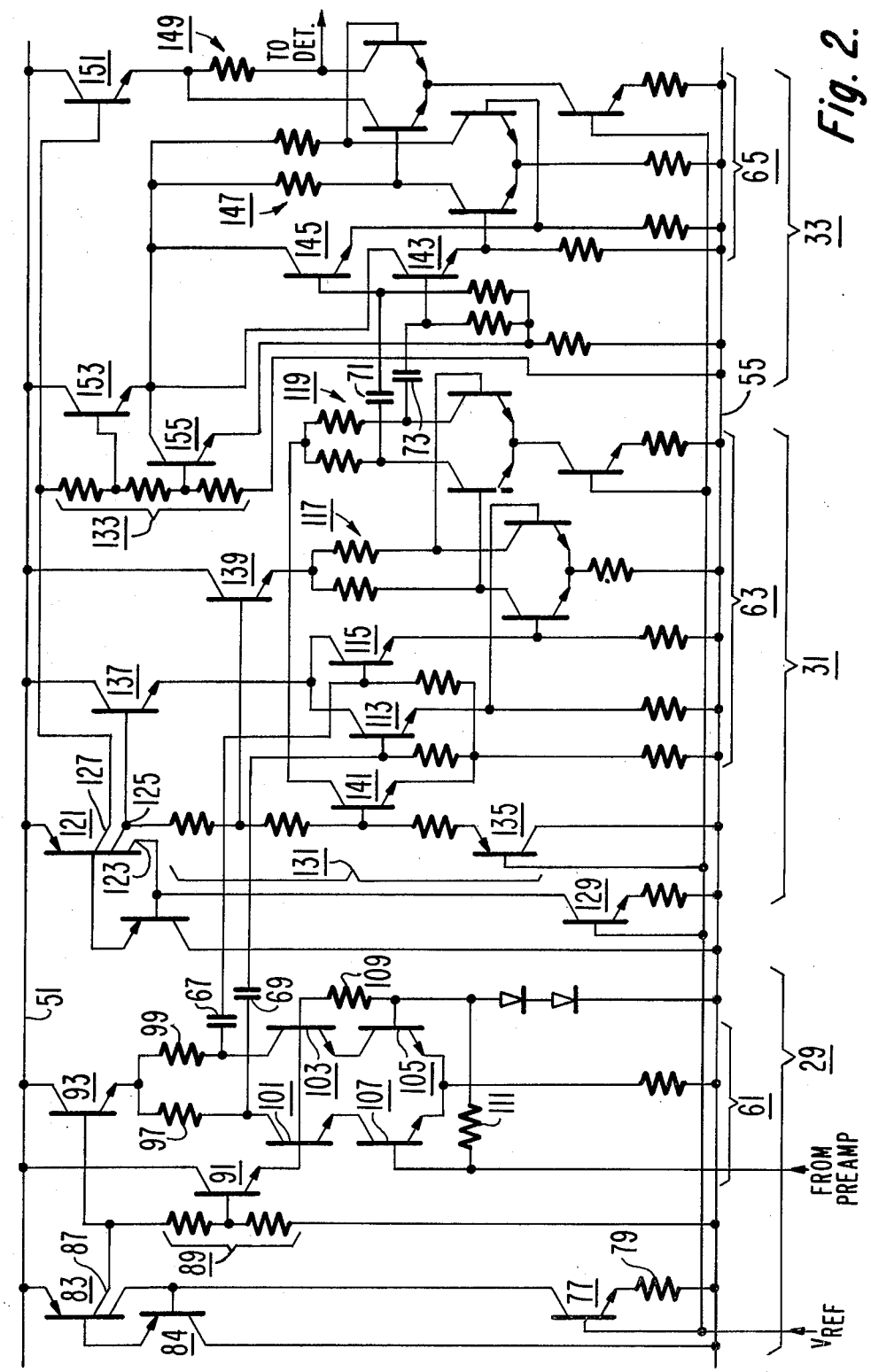

CIRCUIT ARRANGEMENT USEFUL IN DEVELOPING DECOUPLED OPERATING VOLTAGES FOR IF AMPLIFIER STAGES OF AN INTEGRATED CIRCUIT

BACKGROUND OF THE PRESENT INVENTION

The present invention pertains to a circuit arrangement for developing decoupled operating voltages for amplifier stages which may be incorporated in an integrated circuit.

When amplifier stages are coupled in cascade and derive operating voltages from a common power supply line, undesired oscillations may occur. Such oscillations may occur because the power supply line provides a feedback path by which alternating signal developed in one stage may be fed back to a preceding stage. If the cascaded stages provide a phase shift of 180 degrees and a gain greater than unity between an input point and an output point coupled together through the power supply line, the conditions for oscillation are present.

To prevent undesired oscillations of the type described above, a capacitor is often connected between a point near the beginning of the power supply line and a signal ground potential point. Such a capacitor shunts alternating signals to ground thereby reducing the amplitude of alternating signals which are present on the power supply line. This technique is not very effective where the power supply has a relatively high resistance between points coupled together through the power supply line. This latter condition is often found in an integrated circuit in which a supply voltage is applied to several cascaded amplifier stages by means of a relatively thin metalization layer, which is conventionally known in the integrated circuit arts as a power supply rail.

In discrete circuitry individual capacitors may be connected in shunt at points along the power supply line to which respective amplifier stages are connected to attenuate alternating signal on the power supply line which may be fed back from succeeding stages. However, such provisions are not well suited to integrated circuits because capacitors of sufficient value to decouple points along a power supply line to inhibit undesired oscillations at frequencies commonly encountered cannot be incorporated in the integrated circuit without an excessive use of integrated circuit area.

In integrated circuits, power supply points of individual amplifier stages may be decoupled by use of emitter-follower configured transistors. For example, such an arrangement is disclosed in U.S. Pat. No. 3,518,458 issued in the name of Camenzind. In his arrangement, the power supply point of each amplifier stage in an integrated circuit is connected to the emitter electrode of a respective emitter-follower configured transistor. The base electrode of each transistor is connected to a relatively stable voltage source such as a Zener diode. The power supply points of the individual amplifier stages tend to be decoupled because emitter-follower configured transistors exhibit a unilateral impedance transformation from a relatively high impedance at their base electrodes to a relatively low impedance at their emitter electrodes. As a result, alternating signals developed in one amplifier stage are inhibited from reaching and thereby possibly affecting the voltage source and the power supply points on the other amplifier stages. Unfortunately, the isolation afforded by emitter-follower configured transistors is limited to relatively low frequency, e.g., below 10 MHz, applications.

SUMMARY OF THE PRESENT INVENTION

The present invention is directed at inhibiting relatively high frequency, e.g., in the 10 to 20 MHz range, oscillations which may be undesirably developed in an integrated circuit when amplifier stages which share a common power supply rail are cascaded with blocking capacitors between them for the purposes of d-c isolation and the reduction of noise bandwidth. Specifically, each amplifier stage includes a circuit for developing at least one operating voltage for the stage in response to a current which is applied to it from a current source. In each stage the collector of a dedicated lateral transistor or one of the collectors of a shared multicollector lateral transistor is connected at a point at which the voltage developing circuit receives its current. The dedicated or shared lateral transistor may be included in an amplifier configuration for mirroring or duplicating the current supplied by the current source in which its emitter is connected to a common power supply line or rail and its collector is connected to the voltage developing circuit. The latter arrangement operates, as described in detail below, to isolate or decouple the circuit for developing the operating voltage for each stage from alternating signals which may be carried on the common power supply line from another stage.

BRIEF DESCRIPTION OF THE DRAWING

FIG. 2 is a schematic diagram of a specific circuit arrangement of the IF amplifier stages of FIG. 1.

DETAILED DESCRIPTION OF THE DRAWING

Figure 1:
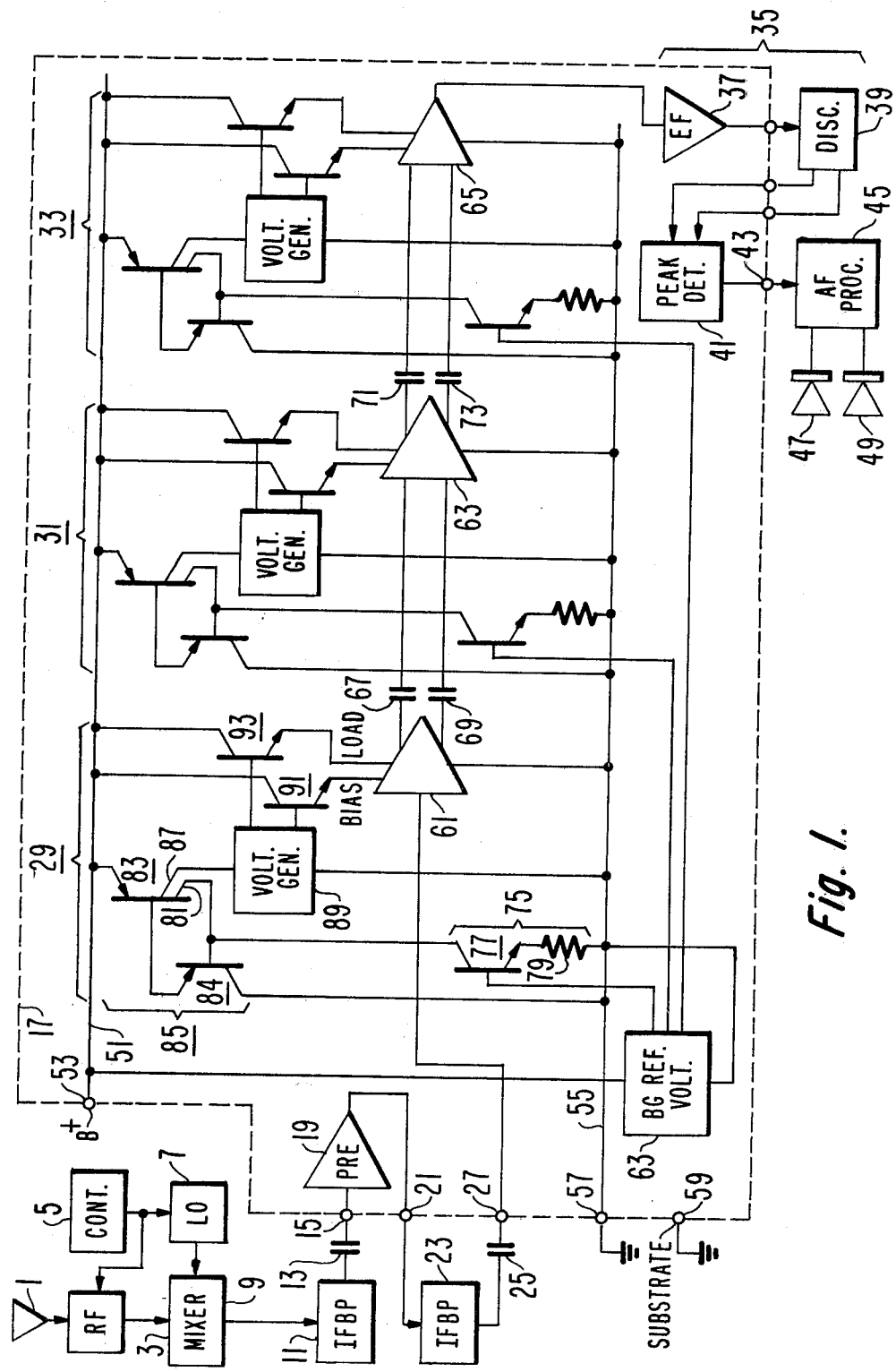
FIG. 1 is a schematic diagram, partially in block form, of an FM radio receiver employing an integrated circuit having cascaded IF amplifier stages coupled to a common power supply line including respective operating voltage developing circuits which are decoupled from one another according to the present invention.

In the FM radio receiver of FIG. 1, RF carriers in the FM frequency range received by an antenna 1 are applied to an RF amplifying and filtering Section 3. RF section 3 is tuned in response to a tuning control voltage generated by a station selector unit 5 to select the one of the received RF carriers associated with a selected station. A local oscillator 7 is also tuned in response to the tuning voltage to generate a local oscillator signal having a frequency appropriate for tuning the selected channel. A mixer 9 heterodynes the selected RF carrier and the local oscillator to generate an IF signal.

The IF signal is filtered by a first IF bandpass (BP) filter 11 and applied through a capacitor 13 to a signal input terminal 15 of an FM signal processing integrated circuit 17. The input signal applied to terminal 15 is amplified by a preamplifier 19 and applied through a terminal 21 to a second IF bandpass filter 23. The filtered signal is applied through a capacitor 25 and a terminal 27 to three cascaded amplifier stages 29, 31 and 33. Stages 29, 31 and 33 successively amplify the IF signal toward upper and lower voltage limits to form a pulse signal.

The pulse output signal is applied to an FM detector section 35 comprising an internal emitter-follower stage 37, an external frequency discriminator network 39 and an internal peak detector 41 which cooperate to generate an AF (audio frequency) signal having an amplitude which depends on the frequency deviation of the pulse signal from a predetermined fixed frequency. An FM detector suitable for use as FM detector 35 is described in U.S. patent application Ser. No. 059,469 filed in the name of the same inventor as the present invention on July 20, 1979 issued on June 9, 1981 as U.S. Pat. No. 4,272,726, and assigned, like the present application, to RCA Corporation. The AF signal is applied through a terminal 43 to audio processing circuit 45, including, e.g., a stereo decoder, audio amplifiers and speaker drivers (not specifically shown), which derive drive signals for speakers 47 and 49.

Integrated circuit 17 may include other circuitry, e.g., for generating a signal indicative of received signal strength for purposes of gain control, audio muting and signal seeking applications. Such circuitry is not shown since it is not germane to the present invention, which relates to the manner circuits for developing operating voltages for each of amplifier stages 29, 31 and 33 are decoupled from one another to prevent undesired oscillations.

A power supply voltage B+ is applied to a power supply line on rail 51 through a terminal 53. Signal ground of the receiver is connected to a ground rail 55 through a terminal 57. Signal ground is also connected to the substrate on which the components of integrated circuit 17 are formed through a terminal 59.

Amplifier stages 29, 31 and 33 include respective differential amplifiers 61, 63 and 65. Differential amplifiers are utilized because they possess common mode signal rejection capabilities which tend to reduce the amplification of undesired noise signals. Furthermore, amplifier stages 29, 31 and 33 are connected by d-c blocking capacitors to the respective preceding amplifier stage to restrict the bandwidth of the IF section at its lower end to, e.g., 2–3 MHz, to reduce the transmission of noise signals which tend to have frequencies in a relatively wide band. Specifically, the single ended output signal of preamplifier 19 is applied to a single-ended input of amplifier 61 through IF bandpass filter 23 and capacitor 25. The differential output signals of amplifier 61 are applied to the differential inputs of amplifier 63 through capacitors 67 and 69. The differential output signals of amplifiers 63 are applied to the differential inputs of amplifier 65 through capacitors 71 and 73.

Since the amplifiers 61, 63 and 65 are all coupled to power supply rail 51, signal variations developed at a point in one amplifier may be fed back to a point in a preceding amplifier. If there is a 180 degree phase shift and a signal gain greater than unity between the points, undesired oscillations may occur. Such oscillations are likely especially because of the high signal gain afforded by limiting amplifiers 61, 63 and 65. Due to the d-c blocking capacitors between stages 61, 63 and 65, oscillations are restricted to relatively high frequencies, e.g., between 10 and 20 MHz.

Amplifier stages 29, 31 and 33 include respective individual circuits for generating respective operating voltages for amplifiers 61, 63 and 65. The circuits for generating operating voltages for each of stages 29, 31 and 33 are arranged to provide stable operating voltages which are substantially unaffected by temperature variations and relatively low frequency variations that might be superimposed upon the B+ voltage. Moreover, the individual circuits for generating operating voltages for amplifiers 61, 63 and 65 decouple the respective amplifiers from relatively high frequency signals appearing on power supply rail 51 and thereby inhibit relatively high frequency oscillations.

Since all of the circuits for developing operating voltages include the same basic structural elements, only the circuit for developing operating voltages for amplifier 61 will be described in detail. The circuit for generating operating voltages includes a current source 75 comprising a NPN transistor 77 having its emitter connected to signal ground through a resistor 79 and its base connected to an output of a reference voltage supply 63. The reference voltage establishes the voltage across resistor 79 and thereby determines (by Ohm's Law) the emitter current of transistor 77. The collector current of transistor 77 is substantially equal to its emitter current less its much smaller base current.

The collector current of transistor 77 is applied to a first collector 81 of a PNP transistor 83. PNP transistor 83 is included in a current mirroring or current duplicating arrangement 85 which duplicates the current applied to first collector 81 at a second collector 87. The current provided at second collector 87 of transistor 83 is applied to a voltage generating circuit 89 which develops operating voltages for amplifier 61 in response to the current provided to it from collector 87 of transistor 83. Voltage generating circuit 89 may simply comprise a resistive voltage divider connected between collector 87 and signal ground or a reference voltage point. A first operating voltage developed by voltage generating circuit 89 is applied through an emitter-follower configured NPN transistor 91 to a biasing circuit of amplifier 61. A second operating voltage developed by voltage generating circuit 89 is applied through another emitter-follower configured NPN transistor 93 to a load circuit of amplifier 61. Emitter-follower configured NPN transistors 91 and 93 isolate the bias and load circuits of amplifier 61 from one another.

PNP transistor 83 may be thought of as comprising an equivalent arrangement with two PNP transistors with identical emitter-base junctions having both of their emitters connected to power supply rail 51 and their bases connected together. As such, a conventional current mirror amplifier including a master and slave transistor is formed for duplicating the current in collector 81 in collector 87. A PNP transistor 84 is coupled in a degenerative feedback path between collector 81 and the base of transistor 83 having its base connected to collector 81 of transistor 83, its emitter connected to the base of PNP transistor and its collector connected to signal ground. PNP transistor 84 effectively tends to reduce the differences between the current gains of the two transistors in the equivalent arrangement which would otherwise degrade their current duplicating operation.

At relatively low frequencies, at which interelectrode capacitances and other high frequency characteristics of transistions are negligible, variations of B+ are developed equally at the base and emitter electrodes of the master and slave transistors. Accordingly, the voltage difference between the emitter and base of each transistor is independent of relatively low frequency variations of B+ variations. As a result, the current in collectors 81 and 87 are independent of relatively low frequency variations of B+ due to, e.g., temperature variations and varying loading conditions. This is desirable when the receiver is employed in an automobile since B+ is supplied from the automobile battery, which is subject to variations of temperature, state of charge, and loading conditions.

Since the current provided to voltage generating circuit 89 at collector 87 of PNP transistor 83 and the generating voltages generated by voltage generating circuit 89 are determined by the current in collector 81, it is desirable that reference voltage source 63 generate reference voltages substantially unaffected by temperature variations. For this purpose, a band gap reference voltage source, such as disclosed in U.S. Pat. No. 4,058,760 (Ahmed), incorporated by reference, may be employed. Such a band gap reference voltage source is additionally desirable since the reference voltages it provides are comparatively free of noise compared with reference voltages developed across semiconductor junctions reverse-biased into avalanche conduction which therefore ordinarily require external bypass capacitors.

Signal variations in amplifier 61 are applied to power supply rail 51 as currents flowing through the collector-emitter paths of emitter-follower transistor 91 and 93. Signal variations in other stages are similarly applied to power supply rail 51 through their respective emitter-followers. PNP transistor 83 of current mirroring arrangement 85 decouples relatively high frequency variations on power supply rail 51 for the following reasons.

PNP transistor 83 is formed in integrated circuit 17 as a lateral structure, i.e., its base, emitter and collector electrodes are laterally rather than vertically oriented with respect to each other and the substrate. In such an arrangement, the segmented collector region has relatively large surface areas which cooperate with the substrate to form relatively large capacitances. Moreover, lateral transistors have poor high frequency gains in any configuration.

The aforementioned properties of lateral PNP transistor 83 enable it to decouple voltage generator 89 from relatively high frequency signals appearing on power supply lines for the following reasons. First, the high frequency current gain between the emitter of lateral PNP transistor 83 and each of its collectors 81 and 87 is extremely low, e.g., between 0.01 and 0.1, at frequencies in the oscillation range, e.g., between 10 and 20 MHz, of the amplifier configuration. Accordingly, any high frequency signals applied to voltage generator 89 by lateral PNP transistor 83 have relatively low amplitudes. Second, any high frequency signals that reach collector 87 of PNP transistor are shunted to signal ground by the capacitance between collector 87 and the substrate which is connected to signal ground.

At low frequencies, transistor 84 provides a degenerative feedback path between collector 81 and the base of transistor 83 which benefits the current duplicating operation of current duplicating arrangement 85 as described above. Fortunately, it has been found that PNP transistor 84 also provides a degenerative feedback path between collector 81 and the base of transistor 83 in the frequency range, e.g., between 10 and 20 MHz, in which oscillations may be established due to the closed loop configuration including cascaded amplifier 61, 63 and 65 and power supply line 51. As a result, in the frequency range of interest, the current gain of transistor 83 is maintained at a low value.

Unfortunately, the phase shift provided by transistor 84 at some frequencies, e.g., 4 to 6 MHz, may provide a regenerative feedback path which establishes an oscillatory condition in the closed loop configuration including transistors 83 and 84. To prevent such undesired oscillations, it is desirable to take measures to degrade the current gain of PNP transistor 84. This may be accomplished by omitting P+ material in the emitter material. This tends to reduce its current gain by reducing its current injection efficiency. A similar result may be obtained by inserting resistance in the feedback loop provided by PNP transistor 84. For this purpose, a resistor may be inserted between collector 81 of transistor 83 and the base of transistor 84, or a resistor may be inserted between the emitter of transistor 84 and the base of transistor 83. It is also possible to degrade the high frequency current gain of PNP transistor 84 by increasing the capacitance between either the collector 81 of transistor 83 or the base of transistor 83 to signal ground. Since a relatively large value capacitor may be required to inhibit oscillations at frequencies between 4 to 6 MHz, this solution is not as desirable as the others. Finally, while PNP transistor 84 is usually made a vertical transistor to conserve integrated circuit area, it may be desirable that PNP transistor 84 be made a lateral transistor because of the poorer high frequency performance of lateral transistors discussed above with respect to lateral PNP transistor 83.

FIG. 2 shows implementations of amplifier stages 29, 31 and 33. Of concern with reference to the present invention is the circuitry for developing the bias and load operating voltages for each stage. Accordingly, amplifiers 29, 31 and 33, the circuitry of which is somewhat similar to that employed in the CA3089 and CA3189 integrated circuits manufactured by the Solid State Division of RCA Corporation, Somerville, N.J., will not be described in detail.

In amplifier stage 29, amplifier 61 comprises a differential cascode amplifier having a single ended input and differential outputs. The circuit for developing the operating voltage of stage 61 is substantially the same as that shown in FIG. 1. Voltage generator 89 is simply a resistive voltage divider connected between collector 87 of PNP transistor 83 and signal ground. An operating voltage developed at collector 87 is applied through emitter-follower configured NPN transistor 93 to load resistors 97 and 99 of amplifier 61. An operating voltage developed at a point along voltage divider 89 is applied through emitter-follower configured NPN transistor 91 to the bases of NPN transistors 101 and 103 and to the bases of NPN transistors 105 and 107 through resistors 109 and 111 to bias the cascode differential amplifier.

In amplifier stage 31, amplifier 63 comprises emitter-follower configured NPN transistors 113 and 115 followed in direct-coupled cascade by first and second differential amplifiers 117 and 119, each of which have differential inputs and outputs. The circuit for developing the operating voltages for amplifier 63 differs from the corresponding circuit in stage 29 in two respects. First, it includes a current mirror configured lateral PNP transistor 121 with three collectors, 123, 125 and 127, rather than two. Collector 123 receives the current to be mirrored from the collector of a NPN transistor 129 included in a current source configuration. Collector 125 provides current to voltage generating circuit 131 for developing operating voltages for amplifier 63. Collector 127 provides current to a voltage generating stage 133 of amplifier stage 33. Accordingly, each of voltage generating circuits 131 and 133 are each decoupled from relatively high frequency signals appearing on power supply rail 51 by using a single multiple collector lateral PNP transistor. Second, voltage generating circuit 131 includes a resistive voltage divider connected in series with the emitter-collector junction of a PNP transistor 135 rather than directly to signal ground. This is beneficial since variations, e.g., due to temperature, of the voltage difference between the base and emitter of NPN transistor 129 tend to be compensated for by corresponding variations of the voltage difference between the emitter and base of PNP transistor 135.

Operating voltages developed at points along the resistive voltage divider of voltage generating circuit 131 are applied through emitter-follower configured NPN transistors 137 and 139 to load resistors of differential amplifiers 117 and 119, and to the collectors of emitter-followers 113 and 115. Another operating voltage developed at another point of the resistive voltage divider of voltage generating circuit 131 is applied through an emitter-follower configured NPN transistor 141 to the bases of emitter-follower configured transistors 113 and 115 to establish the bias of amplifier 63.

In amplifier stage 33, amplifier 65 comprises two emitter-follower configured NPN transistors 143 and 145 followed in direct-coupled cascade by first and second differential amplifiers 147 and 149. Differential amplifier 147 has differential inputs and outputs while differential amplifier 149 has differential inputs and a single-ended output.

Operating voltages are developed along a resistive voltage divider comprising voltage generating circuit 133. Operating voltages are applied through emitter-follower configured NPN transistors 151 and 153 to load resistors of differential amplifiers 149 and 147, respectively. Another operating voltage is applied through an emitter-follower configured NPN transistor 155 to the bases of emitter-follower configured NPN transistor 143 and 145 to establish the bias point of amplifier 65.

While the present invention has been described in terms of an arrangement in which the collectors of at least two separate lateral transistors are connected to respective voltage generating circuits, an arrangement in which separate collectors of a single multi-collector lateral transistor are connected to each respective voltage generating circuit may be employed. With this, while the present invention has been described in terms of an arrangement in which at least two separate current sources provide current to respective voltage generating circuits, an arrangement in which a single current source provides current to all of the voltage generating circuits may be employed. In addition, while the present invention has been described in terms of current mirror amplifier configurations comprising a single multi-collector lateral transistor, current mirror amplifier configurations including two separate lateral transistors may also be employed. Further, while the current mirror amplifier configurations have been described as providing a current substantially the same as the current received from a current source, the current mirror amplifier configurations may be arranged, in ways well known in the circuit arts, to provide a current different from the current received from a current source. Still further, while the current mirror amplifier configurations have been described as including emitters directly connected to a power supply line, the emitters may be indirectly connected, e.g., through resistors, to a power supply line. These and other modifications are intended to be included within the scope of the present invention as defined by the following claims.

What is claimed is:

1. An integrated circuit constructed on a substrate, comprising:
    at least two amplifier stages including respective amplifiers;
    coupling means for coupling said amplifiers in cascade;
    a power supply line;
    a signal ground line;
    each of said amplifiers coupled between said power supply line and said signal ground line;
    means for applying the a-c potential at said signal ground line to said substrate;
    each of said amplifier stages including its own voltage generating means including a respective receiving current point for developing at lest one operating voltage for the respective one of said amplifier in response to the application of a predetermined current to said current receiving point; and
    current supplying means including a lateral transistor arrangement having a separate collector electrode connected to each of said current receiving points, at least one pair of base and emitter electrodes with said emitter electrode connected to said power supply line; and means for conditioning the junction between at least said pair of base and emitter electrodes so that predetermined currents are supplied to each of said current receiving points through the respective ones of said collector electrodes.

2. The apparatus recited in claim 1 wherein:
    said coupling means includes capacitive means for transmitting a-c signals in a predetermined range of frequencies from the output of a first one of said amplifiers to the input of a second one of said amplifiers and for blocking the transmission d-c signals from the output of said first one of said amplifiers to the input of said second one of said amplifiers.

3. The apparatus recited in claim 2 wherein:
    said predetermined range of frequencies is the IF range of a receiver.

4. The apparatus recited in claim 2 wherein:
    said conditioning means includes at least one current source for providing a master current; and at least one current mirror amplifier configuration including the junction between at least said pair of base and emitter electrodes of said lateral transistor arrangement and a point for receiving said master current for supplying a slave current for at least one current receiving point through the respective one of said collector electrodes in response to said master current.

5. The apparatus recited in claim 4 wherein:
    said current supplying means includes a transistor having base, emitter and collector electrodes configured to provide degenerative feedback between said point for receiving said master current and said base electrode of said pair of base and emitter electrodes; and means for reducing the gain of said feedback transistor in said predetermined frequency range.

6. The apparatus recited in claim 2 wherein:
    said lateral transistor arrangement includes a separate lateral transistor, having a base electrode, an emitter electrode and at least one collector electrode, for each one of said voltage generating means, said collector electrodes of each of said separate transistors being connected to a respective one of said current receiving points.

7. The apparatus recited in claim 6 wherein:
each of said lateral transistors has an additional collector electrode; and
said conditioning means includes means for supplying a master current to each of said additional collector electrodes.

8. The apparatus recited in claim 2 wherein:
said lateral transistor arrangement includes a multiple-collector lateral transistor, having a base electrode, an emitter electrode and at least two separate collector electrodes, each of said collector electrodes being connected to a respective one of said current receiving points.

9. The apparatus recited in claim 8 wherein:
said multiple-collector electrode includes an additional collector electrode; and
said condition means includes means for supplying a master current to said additional collector electrode.

10. The apparatus recited in claim 7 or claim 9 wherein:
said means for supplying a master current includes first resistive means having first and second ends; a first transistor having base, emitter and collector electrodes, said master current being provided at said collector electrode, said emitter electrode connected to a first end of said first resistive means; and means for developing a reference voltage between said base electrode of said first transistor and the second end of said first resistive means.

11. The apparatus recited in claim 10 wherein:
at least one of said voltage generating means includes second resistive means having first and second ends, said first end of said second resistive means being connected to said respective current receiving point; a second transistor of a conductivity type opposite to that of said first transistor included in said means for supplying a master current and having base, emitter and collector electrodes, said emitter electrode being connected to said second end of said second resistive means; and means for developing a reference voltage between said base and collector electrodes of said second transistor.

12. The apparatus recited in claim 11 wherein:
said means for developing a reference voltage between said base electrode of said first transistor and the second end of said first resistive means includes a band gap reference voltage supply.

13. The apparatus recited in claim 12 wherein:
said means for developing a reference voltage between said base and collector electrodes of said second transistor includes said band gap reference voltage supply.

14. The apparatus recited in claim 2 wherein each of said amplifier stages includes a bias circuit for establishing the bias of said respective amplifier and a load circuit of said amplifier; and
each of said voltage generating means includes voltage divider means for generating first and second operating voltages for said amplifier stage; a first transistor having base, emitter and collector electrodes configured as an emitter-follower amplifier, said first operating voltage being applied to said base electrode, said emitter electrode being connected to said bias circuit, and said collector electrode being connected to said power supply line; and a second transistor having base, emitter and collector electrodes configured as an emitter-follower amplifier, said second operating voltage being applied to said base electrode, said emitter electrode being connected to said load circuit, and said collector electrode being connected to said power supply line.

15. The apparatus recited in claim 14 wherein:
each of said amplifiers includes a differential amplifier.

16. In a receiver, apparatus comprising:
at least two amplifier stages including respective amplifiers for amplifying signals in an IF range, at least a portion of said amplifier stages constructed on a semiconductor substrate;
capacitive means coupled between an output of a first one of said amplifiers and an input of a second one of said amplifiers for transmitting signals in said IF range between said output and said input and for inhibiting the transmission of signals with frequencies below said IF range;
a power supply line;
a signal ground line;
each of said amplifiers coupled between said power supply line and said signal ground line;
means for applying the a-c potential at said signal ground line to said substrate;
each of said amplifier stages including its own voltage generating means including a respective current receiving point for developing at least one operating voltage for the respective one of said amplifiers in response to the application of a predetermined current to said current receiving point; and
current supplying means including a lateral transistor arrangement formed on said substrate having a separate collector electrode connected to each of said current receiving points, at least one pair of base and emitter electrodes with said emitter electrode connected to said power supply line; and means for conditioning the junction between at least said pair of base and emitter electrodes so that predetermined currents are supplied to each of said current receiving points through the respective ones of said collector electrodes.

* * * * *